United States Patent [19]

Kawada et al.

[11] Patent Number: 5,566,043
[45] Date of Patent: Oct. 15, 1996

[54] CERAMIC ELECTROSTATIC CHUCK WITH BUILT-IN HEATER

[75] Inventors: Nobuo Kawada; Toshihiko Shindoh; Takaaki Nagao; Kazuhiko Urano, all of Gunma-ken; Junichi Arami, Tokyo; Kenji Ishikawa, Kanagawa-ken, all of Japan

[73] Assignees: Shin-Etsu Chemical Co., Ltd.; Tokyo Electoron Limited, both of Tokyo, Japan

[21] Appl. No.: 364,191

[22] Filed: Dec. 27, 1994

[30] Foreign Application Priority Data

Dec. 27, 1993 [JP] Japan ................................ 5-330962
Dec. 20, 1994 [JP] Japan ................................ 6-316410

[51] Int. Cl.$^6$ ............................................... H02N 13/00
[52] U.S. Cl. ............................................................ 361/234
[58] Field of Search ............................ 361/234; 279/128; 269/8; 29/825, 829

[56] References Cited

U.S. PATENT DOCUMENTS 5,155,652  10/1992  Logan et al. ............................. 361/234
5,280,156  1/1994  Niori et al. ........................ 361/234 X

*Primary Examiner*—Fritz M. Fleming
*Attorney, Agent, or Firm*—McAulay Fisher Nissen Goldberg & Kiel, LLP

[57] ABSTRACT

The ceramic electrostatic chuck with built-in heater of the present invention is disclosed having electrodes for electrostatic chuck made from an electroconductive ceramic bonded to a surface of a supporting substrate made from an electrically insulating ceramic, a heat generating layer made from an electroconductive ceramic is bonded to the other surface and the side surface and a covering layer made from an electrically insulating ceramic is provided thereon.

10 Claims, 1 Drawing Sheet

CERAMIC ELECTROSTATIC CHUCK WITH BUILT-IN HEATER

BACKGROUND OF THE INVENTION

The present invention relates to a ceramic electrostatic chuck with built-in heater or more particularly, to a ceramic electrostatic chuck with built-in heater used in the temperature elevation and lowering step in a semiconductor process.

While a heater by winding a metal wire is used heretofore for heating of a semiconductor wafer in the manufacturing process of semiconductor devices, a problem is involved therein by the contamination of the semiconductor wafer with metals so that proposals have been made for the use of an integral ceramic heater using a thin film of a ceramic as the heat generating body (see official publication of Japanese Patent Kokai No. 4-124076). Further, while an electrostatic chuck is used when a semiconductor wafer is heated in an atmosphere of a reduced pressure in order to fix the semiconductor wafer on the heater, resins as the material thereof are increasingly replaced with ceramics along with the trend toward higher and higher temperatures of the process (see official publication of Japanese Patent Kokai No. 52-67353 and official publication of Japanese Patent Kokai No. 59-124140) and, recently, a ceramic electrostatic chuck with built-in heater, which is an integral combination of such a ceramic heater and electrostatic chuck, is also proposed (see official publication of Japanese Patent Ko-kai No. 5-09876 and official publication of Japanese Patent Kokai No. 5-129210). And, since this ceramic electrostatic chuck with built-in heater basically has a structure in which different kinds of ceramics are bonded together, warping is caused due to the difference in their thermal expansion coefficients to decrease the chucking force so that a proposal has been made for a ceramic electrostatic chuck with built-in heater in which warping is prevented by using a substrate of a large thickness (see official publication of Japanese Patent Kokai No. 4-358074).

However, such a ceramic electrostatic chuck with built-in heater by the use of a substrate of a large thickness has a problem that the quantity of heat dissipated from the side surface of the substrate is so large as to produce a heat flow from the center to the side portion so that the temperature in the vicinity of the side portion is decreased not to give a uniform temperature distribution and the yield of acceptable devices manufactured therewith is decreased thereby.

SUMMARY OF THE INVENTION

The present invention relates to a ceramic electrostatic chuck with built-in heater to solve these disadvantages and defects, which is characterized in that electrodes for electrostatic chuck made from an electroconductive ceramic are bonded to a surface of a supporting substrate made from an electrically insulating ceramic, a heat generating layer made from an electroconductive ceramic is bonded to the other surface and the side surface and a covering layer made from an electrically insulating ceramic is provided thereon and also characterized in that a diffusion-preventing layer is bonded on to the said covering layer.

That is, the inventors have conducted extensive investigations on the method to improve the non-uniformity of temperature in a heretofore known ceramic electrostatic chuck with built-in heater and as a result, have arrived at a discovery that the heat flow from the center to the side surface thereof never takes place when electrodes for electrostatic chuck made from an electroconductive ceramic are bonded to a surface of a supporting substrate made from an electrically insulating ceramic, a heat generating layer made from an electroconductive ceramic is bonded to the other surface and the side surface and a covering layer made from an electrically insulating ceramic is provided thereon with confirmation that thereby the ceramic electrostatic chuck with built-in heater can be imparted with good uniformity of temperature distribution because the heat flow from the center to the side surface thereof never takes place leading to completion of the present invention after continued studies on the kinds of the electrically insulating ceramic members and electroconductive ceramics and so on when the same is used in a semiconductor process.

Figure 1:
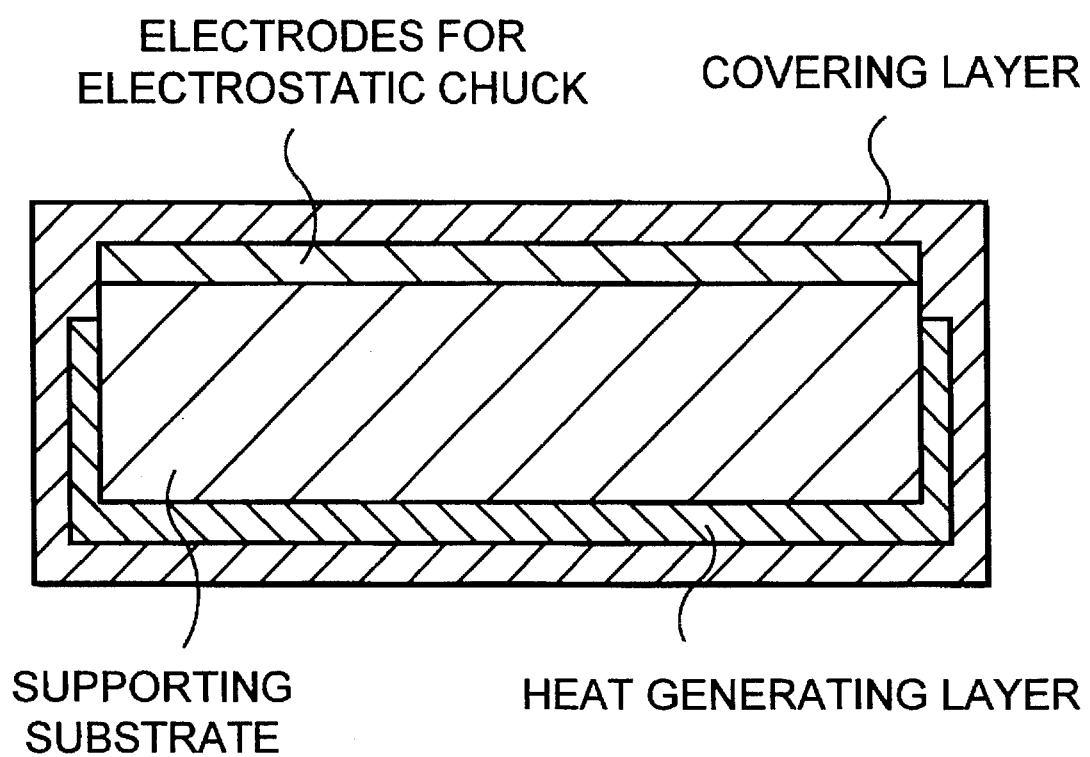
FIG. 1 shows a vertical cross sectional view of an example of the ceramic electrostatic chuck with built-in heater of the present invention.

The present invention relates to a ceramic electrostatic chuck with built-in heater which is, as is illustrated in FIG. 1, characterized in that electrodes for electrostatic chuck made from an electroconductive ceramic are bonded to a surface of a supporting substrate made from an electrically insulating ceramic, a heat generating layer made from an electroconductive ceramic is bonded to the other surface and the side surface and a covering layer made from an electrically insulating ceramic is provided thereon, whereby this ceramic electrostatic chuck with built-in heater is imparted with an advantage of improved uniformity of the temperature distribution because the heat flow from the center to the side surface never never takes place.

The ceramic electrostatic chuck with built-in heater in the prior art is formed by bonding electrodes for electrostatic chuck made from an electroconductive ceramic on to a surface of a supporting substrate made from an electrically insulating ceramic along with bonding of a heat generating layer made from an electroconductive ceramic on to the other surface and providing a covering layer made from an electrically insulating ceramic thereon and, although this constitution is known, such a known ceramic electrostatic chuck with built-in heater has a very serious defect that the quantity of heat dissipated from the side surface of the substrate is large and a heat flow from the center to the side portion is caused not to ensure a uniform distribution of temperature due to the decrease in the temperature so that the yield of acceptable products of the devices manufactured therewith is decreased.

In contrast thereto, when the heat generating layer is provided also on the side surface of the supporting substrate as is shown in FIG. 1 according to the present invention, a heat flow from the side surface to the center is generated in such a fashion as to cancel the heat flow from the center of the substrate to the side surface so that this ceramic electrostatic chuck with built-in heater is freed from a temperature decrease in the vicinity of the side portion and consequently this ceramic electrostatic chuck with built-in heater is imparted with increased uniformity in the temperature distribution to give an advantage that the yield of acceptable products of the devices manufactured therewith is increased.

As is described above, the ceramic electrostatic chuck with built-in heater of the present invention comprises a supporting substrate, electrodes for electrostatic chuck, heat generating layer and covering layer. This supporting substrate is made from an electrically insulating ceramic and, since the ceramic electrostatic chuck with built-in heater of the present invention has an object, in particular, for the use in the semiconductor process and this semiconductor process involves not only Si semiconductors but also III–V Group compound semiconductors, it is preferably made from boron nitride, a mixture of boron nitride and aluminum nitride or silicon nitride constituted from the elements belonging to the same groups of elements as those while this boron nitride can be obtained by sintering according to a known method or can be that by the chemical vapor-phase deposition method obtained by reacting, for example, ammonia and boron trichloride under the conditions of 1600° to 1800° C. and 100 Torr.

The mixture of boron nitride and aluminum nitride can be that obtained by sintering according to a known method and this silicon nitride can be that obtained by sintering according to a known method or can be that by the chemical vapor-phase deposition method obtained by reacting, for example, ammonia and silicon tetrachloride under the conditions of 1400° to 1500° C. and 5 Torr. When a mixture of boron nitride and aluminum nitride is used for the supporting substrate, incidentally, these materials have anisotropy that the linear expansion coefficient depends on the directions and the difference between the linear expansion coefficient of the electrodes for electrostatic chuck and the heat generating layer bonded thereto and the linear expansion coefficient of the supporting substrate differs from surface to surface with an increased trend for separation at the bonded parts in the surface having a large value of this difference so that the supporting substrate is preferably made from boron nitride or a mixture of boron nitride and aluminum nitride of which the anisotropy of thermal expansion expressed by [maximum value of linear expansion coefficient/minimum value of linear expansion coefficient] does not exceed 3.

The boron nitride or mixture of boron nitride and aluminum nitride having anisotropy of thermal expansion not exceeding 3 mentioned above can be that obtained by a known method and, for example, can be that obtained by sintering a powder mixture of boron nitride and aluminum nitride under the conditions of a temperature of 1900° C. and pressure of 200 kgf/cm$^2$ by the method of heating under isotropic hydrostatic pressure. And, the electrodes for electrostatic chuck and the heat generating layer used here are made from an electroconductive ceramic which should be pyrolytic graphite in respect of the linear expansion coefficient close to that of and relatively good adhesion to boron nitride as the supporting substrate and it can be obtained, for example, by the pyrolysis of methane gas under the conditions of 1900° to 2200° C. and 5 Torr but it can be silicon carbide by the chemical vapor-phase deposition method obtained by reacting an organosilicon compound such as methyl trichloro silane under the conditions of 1250° C. and 8 Torr.

And, the covering layer used here is made from an electrically insulating ceramic which can be the same one as the supporting substrate so that, when it is boron nitride, a mixture of boron nitride and aluminum nitride or silicon nitride, it can be prepared by the same method as the supporting substrate while it should preferably be by the chemical vapor-phase deposition method from the standpoint of purity. The ceramic electrostatic chuck with built-in heater of the present invention by bonding electrodes for electrostatic chuck made from an electroconductive ceramic to a surface of the supporting substrate made from an electrically insulating ceramic, bonding a heat generating layer made from an electroconductive ceramic to the other surface and the side surface and providing a covering layer made from an electrically insulating ceramic thereon is free from a decrease of temperature in the vicinity of the side portion because a heat flow is generated from the side surface to the center by means of the heat generating layer provided on the side surface of the supporting substrate in such a fashion as to cancel the heat flow from the center of the substrate to the side surface so that uniformity of the temperature distribution can be ensured in this ceramic electrostatic chuck with built-in heater.

Incidentally, when this covering layer is made from boron nitride or a mixture of boron nitride and aluminum nitride, being a compound of the same groups as the III–V Group compound semiconductors, the ceramic electrostatic chuck with built-in heater of the present invention is free from contamination of the compound semiconductor with the element of Group IV and, when made from silicon nitride, free from contamination of the Si semiconductors with the element of the Group III. And, the high insulating resistance possessed by boron nitride is required for this covering layer in some cases because a problem in some of the processes is the damage on the devices by the leak current of the electrostatic chuck. When this covering layer is made from boron nitride, however, contamination of silicon semiconductors by the diffusion of boron in this covering layer is caused, especially, in a high temperature process but this contamination can be prevented by providing a diffusion-preventing layer of silicon oxide, silicon nitride and the like on this covering layer. Further, when the boron nitride, silicon nitride, graphite and silicon carbide are formed by the chemical vapor-phase deposition method, a high purity is ensured without containing impurities such as binders and the like as compared with those prepared by the sintering method so that an advantage is obtained that troubles due to contamination with impurities are never caused even when used in a semiconductor process.

In the following, Examples and Comparative Examples of the present invention are given.

Example 1 and Comparative Example 1

A disc made from pyrolytic boron nitride having a diameter of 160 mm and a thickness of 10 mm was prepared by reacting ammonia and boron trichloride under the conditions of 1800° C. and 100 Torr followed by the pyrolysis of methane gas above the same under the conditions of 2200° C. and 5 Torr to form a pyrolytic graphite layer having a thickness of 40 μm thereon which was mechanically worked into an electrode pattern on one surface and a heater pattern on the other surface and side surface to serve as the electrodes for electrostatic chuck and heat generating layer, respectively.

In the next place, ammonia and boron trichloride were reacted above the same under the conditions of 2000° C. and 10 Torr to provide a covering layer of pyrolyric boron nitride having a thickness of 100 μm thereon so as to prepare a ceramic electrostatic chuck with built-in heater, of which temperature was increased up to 1000° C. to find that the uniformity of temperature was satisfactory with a temperature difference of 3° C. between the central portion and the peripheral portion.

For comparison, however, a ceramic electrostatic chuck with built-in heater was prepared in the same treatment as in this Example except that the heat generating layer was omitted on the side portion of the supporting substrate, which was subjected to the same test to find that the uniformity of temperature was poor with a temperature difference of 15° C. between the central portion and the peripheral portion.

Example 2 and Comparative Example 2

A disc of silicon nitride having a diameter of 160 mm and a thickness of 10 mm by the chemical vapor-phase deposition method was prepared by reacting ammonia and silicon tetrachloride under the conditions of 1400° C. and 5 Torr followed by the pyrolysis of methyl trichloro silane under the conditions of 1250° C. and 3 Torr above the same to form a silicon carbide layer having a thickness of 100 μm by the chemical vapor-phase deposition method thereon which was mechanically worked into an electrode pattern on one surface and a heater pattern on the other surface and side surface to serve as the electrodes for electrostatic chuck and heat generating layer, respectively.

In the next place, ammonia and silicon tetrachloride were reacted above it under the conditions of 1400° C. and 5 Torr to provide a covering layer of silicon nitride by the chemical vapor-phase deposition method having a thickness of 150 μm thereon so as to prepare a ceramic electrostatic chuck with built-in heater, which was subjected to temperature elevation up to 800° C. to find good uniformity of temperature with a temperature difference of 2° C. between the central portion and the peripheral portion.

For comparison, however, a ceramic electrostatic chuck with built-in heater was prepared by the same treatment as in this Example except that the heat generating layer was omitted on the side surface of the supporting substrate, which was subjected to the same test to find that the uniformity of temperature was poor with a temperature difference of 13° C. between the central portion and the peripheral portion.

Example 3 and Comparative Example 3

A disc of silicon nitride having a diameter of 160 mm and a thickness of 10 mm by the chemical vapor-phase deposition method was prepared by reacting ammonia and silicon tetrachloride under the conditions of 1400° C. and 5 Torr followed by the pyrolysis of methane gas under the conditions of 2200° C. and 5 Torr above the same to form a pyrolyric graphite layer having a thickness of 60 μm thereon which was mechanically worked into an electrode pattern on one surface and a heater pattern on the other surface and side surface to serve as the electrodes for electrostatic chuck and heat generating layer, respectively.

In the next place, ammonia and silicon tetrachloride were reacted above the same under the conditions of 1400° C. and 5 Torr to provide a covering layer of silicon nitride by the chemical vapor-phase deposition method having a thickness of 100 μm thereon so as to prepare a ceramic electrostatic chuck with built-in heater, which was subjected to temperature elevation up to 800° C. to find good uniformity of temperature with a temperature difference of 3° C. between the central portion and the peripheral portion.

For comparison, however, a ceramic electrostatic chuck with built-in heater was prepared by the same treatment as in this Example except that the heat generating layer was omitted on the side surface of the supporting substrate, which was subjected the the same test to find that the uniformity of temperature was poor with a temperature difference of 18° C. between the central portion and the peripheral portion.

Example 4 and Comparative Example 4

A disc of sintered blend body of boron nitride and aluminum nitride having a diameter of 200 mm and a thickness of 30 mm was prepared by blending a boron nitride powder and aluminum nitride powder in a proportion of 3:1 followed by sintering under the conditions of 1900° C. and 200 kgf/cm². Incidentally, the anisotropy of thermal expansion was determined thereof in terms of [maximum value of linear expansion coefficient/minimum value of linear expansion coefficient] to find that the anisotropy was 2.9.

In the next place, methane gas was pyrolyzed above the same under the conditions of 2200° C. and 5 Torr to form a pyrolytic graphite layer having a thickness of 100 μm thereon which was mechanically worked into an electrode pattern on one surface and a heater pattern on the other surface and side surface to serve as the electrodes for electrostatic chuck and heat generating layer, respectively. Further, ammonia and boron trichloride were reacted above the same under the conditions of 1800° C. and 5 Torr to provide a covering layer of pyrolytic boron nitride having a thickness of 200 μm thereon so as to prepare a ceramic electrostatic chuck with built-in heater, which was subjected to temperature elevation up to 800° C. to find good uniformity of temperature with a temperature difference of 1° C. between the central portion and the peripheral portion.

For comparison, however, a ceramic electrostatic chuck with built-in heater was prepared by the same treatment as in this Example except that the heat generating layer was omitted on the side surface of the supporting substrate, which was subjected to the same test to find that the uniformity of temperature was poor with a temperature difference of 14° C. between the central portion and the peripheral portion.

The present invention relates to a ceramic electrostatic chuck with built-in heater, which is, as is described above, characterized in that electrodes for electrostatic chuck made from an electroconductive ceramic are bonded to a surface of a supporting substrate made from an electrically insulating ceramic, a heat generating layer made from an electroconductive ceramic is bonded to the other surface and side surface and a covering layer made from an electrically insulating ceramic is provided thereon, in which, since electrodes for electrostatic chuck made from an electroconductive ceramic are bonded to a surface of a supporting substrate made from an electrically insulating ceramic, a heat generating layer made from an electroconductive ceramic is bonded to the other surface and the side surface and a covering layer made from an electrically insulating ceramic is provided thereon, no heat flow from the center of the supporting substrate to the side surface takes place so that this ceramic electrostatic chuck with built-in heater is imparted with an advantage that the temperature is not decreased in the vicinity of the side portion and consequently this ceramic electrostatic chuck with built-in heater has a uniform temperature distribution so that the yield of acceptable products of devices manufactured therewith is increased.

We claim:

1. A ceramic electrostatic chuck having a built-in heater comprising a supporting substrate of an electrically insulating ceramic having first and second opposing surfaces and a side surface, an electrode of an electroconductive ceramic bonded to the first surface of the substrate, a heat generating layer of an electroconductive ceramic bonded to the second and the side surfaces, and a covering layer of an electrically insulating ceramic covering said electrodes and heat generating layer.

2. The ceramic electrostatic chuck with built-in heater described in claim 1 in which the said supporting substrate and said covering layer are made from boron nitride, a mixture of boron nitride and aluminum nitride or silicon nitride and the said electrodes for electrostatic chuck and said heat generating layer are made from graphite or silicon carbide.

3. The electrostatic chuck of claim 2 wherein the supporting substrate is made from boron nitride or a mixture of boron nitride and aluminum nitride, the supporting substrate having maximum and minimum coefficient of linear thermal expansion the difference between which does not exceed 3.

4. The ceramic electrostatic chuck with built-in heater described in claim 3 in which a diffusion-preventing layer is bonded on to the said covering layer.

5. The ceramic electrostatic chuck with built-in heater described in claim 4 in which the diffusion-preventing layer is made from silicon oxide or silicon nitride.

6. The ceramic electrostatic chuck with built-in heater described in claim 2 in which a diffusion-preventing layer is bonded on to the said covering layer.

7. The ceramic electrostatic chuck with built-in heater described in claim 6 in which the diffusion-preventing layer is made from silicon oxide or silicon nitride.

8. The ceramic electrostatic chuck with built-in heater described in claim 2 in which the said electrodes for electrostatic chuck, said heat generating layer and said covering layer are prepared by chemical vapor-phase deposition.

9. The ceramic electrostatic chuck with built-in heater described in claim 1 in which a diffusion-preventing layer is bonded on to the said covering layer.

10. The ceramic electrostatic chuck with built-in heater described in claim 9 in which the diffusion-preventing layer is made from silicon oxide or silicon nitride.

* * * * *